United States Patent
Kwean

(10) Patent No.: US 7,872,940 B2
(45) Date of Patent: Jan. 18, 2011

(54) SEMICONDUCTOR MEMORY DEVICE AND METHOD FOR TESTING THE SAME

(75) Inventor: Ki-Chang Kwean, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 181 days.

(21) Appl. No.: 12/154,943

(22) Filed: May 28, 2008

(65) Prior Publication Data

US 2009/0154271 A1    Jun. 18, 2009

(30) Foreign Application Priority Data

Dec. 12, 2007    (KR) ........................ 10-2007-0128812

(51) Int. Cl.
*G11C 8/00* (2006.01)
(52) U.S. Cl. .............. 365/233; 365/189.11; 365/189.05
(58) Field of Classification Search ................ 365/233, 365/189.11, 189.05, 203, 200, 201, 189.12, 365/230.03, 193, 194, 230.08
See application file for complete search history.

(56) References Cited

U.S. PATENT DOCUMENTS

| | | | | |
|---|---|---|---|---|
| 6,330,196 B1 * | 12/2001 | Protzman | ............... | 365/189.11 |
| 6,546,510 B1 * | 4/2003 | Mazumder et al. | .......... | 714/718 |
| 7,126,865 B2 * | 10/2006 | Hong et al. | ................. | 365/201 |
| 2004/0085832 A1 * | 5/2004 | Kanda et al. | ................ | 365/200 |
| 2007/0088921 A1 * | 4/2007 | Kim et al. | .................... | 711/154 |
| 2008/0151678 A1 * | 6/2008 | Ikeda et al. | ............ | 365/230.03 |

FOREIGN PATENT DOCUMENTS

| | | |
|---|---|---|
| KR | 10-2005-0074246 A | 7/2005 |
| KR | 10-2005-0089900 A | 9/2005 |
| KR | 10-0576453 B1 | 4/2006 |

* cited by examiner

*Primary Examiner*—Dang T Nguyen
(74) *Attorney, Agent, or Firm*—Blakely, Sokoloff, Taylor & Zafman

(57) ABSTRACT

Semiconductor memory device and method for testing the same includes a unit for characterized in that a burst length is increased in a test of a read operation and a write operation and a unit for connecting a plurality of banks to one data pad by sequentially and outputting the data.

20 Claims, 10 Drawing Sheets

_US 7,872,940 B2_

SEMICONDUCTOR MEMORY DEVICE AND METHOD FOR TESTING THE SAME

CROSS-REFERENCE TO RELATED APPLICATIONS

The present invention claims priority of Korean patent application number 10-2007-0128812, filed on Dec. 12, 2007, which is incorporated by reference in its entirety.

BACKGROUND OF THE INVENTION

The present invention relates to a semiconductor memory device, and more particularly, to a semiconductor memory device capable of reducing additional circuits required in a test operation after a large-capacity semiconductor memory device is fabricated.

In a system with a variety of semiconductor devices, a semiconductor memory device serves as a data storage. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies are advanced, semiconductor memory devices are required to input and output data at higher speed. In recent years, there is a demand for a semiconductor memory device capable of storing a larger amount of data and reading/writing data at faster speed. Hence, design and fabrication of the semiconductor memory device become more complex, and a test operation of the semiconductor memory device also becomes complex. The number of operations to be tested increases, and the test operations becomes complex, leading to the increase of a test time. Therefore, the mass production of the semiconductor memory device becomes increasingly more difficult. Many efforts have been made to prevent the reduction of productivity.

FIG. 1 is a block diagram of a conventional semiconductor memory device.

Referring to FIG. 1, the conventional semiconductor memory device includes a plurality of bands 120_0 to 120_3, a bank controller 140 for enabling the banks 120_0 to 120_3, and a plurality of data pads 160_1 through 160_4 through which data output from the banks 120_0 to 120_3 are output to the outside. Although FIG. 1 illustrates the data pads used to transfer data output from the banks in a test operation after the fabrication of the semiconductor memory device, more data pads are included in the semiconductor memory device.

When a read or write command is input to a semiconductor memory device in a test operation, the bank controller 10 simultaneously activates bank select signals STROBE_0 to STROBE_3 for selecting the respective banks 120_0 to 120_3. When the write command is input, data input through the data pads 160_1 to 160_4 are stored in the selected banks 120_0 to 120_3. When the read command is input, data stored in the selected banks 120_0 to 120_3 are output through the data pads 160_1 to 160_4.

FIG. 2 is a timing diagram illustrating data input/output timing of the conventional semiconductor memory device of FIG. 1. It is assumed that a write latency (WL) is 1tCK, a column address strobe (CAS) latency (CL) is 2tCK, and a burst length (BL) is 4.

Referring to FIG. 2, when a write command WT is input to the semiconductor memory device, write data are input through the data pads 160_0 to 160_4 after a write latency (WL). The input write data are transferred through global input/output lines GIO_0<0:3> to GIO_3<0:3> to banks 120_0 to 120_3 selected by bank select signals STROBE_0 to STROBE_3 activated in response to the write command WT.

When a read command RD is input, stored data are output through the data pads 160_1 to 160_4 after a CAS latency (CL). The bank controller 140 enables the bank select signals STROBE_0 to STROBE_3 in response to the read command RD, and data output from the banks 120_0 to 120_3 selected in response to the bank select signals STROBE_0 to STROBE_3 are transferred to the data pads 160_1 to 160_4. At this point, the input or output data are transferred in synchronization with rising and falling edges of a system clock CLK. In addition, four data per data pad are successively transferred according to the burst length (BL).

The conventional semiconductor memory device uses four data pads 160_1 to 160_4 to test the data input and output operations. Therefore, in order to test data input or output through the four data pads 160_1 to 160_4, four channels of a test apparatus must be allocated. That is, at least four channels are allocated in the semiconductor memory device in order to test a basic operation of the semiconductor memory device, such as the data input and output operations.

As the operating speed of the semiconductor memory device is gradually increasing and the semiconductor memory device is highly integrated, the internal structure and operation becomes more complex and the test operation also becomes more complex. A test time can be reduced by allocating more channels of the test apparatus to the semiconductor memory device. However, in this case, a manufacturing cost increases because more test apparatuses are used. Therefore, there is a demand for a method and internal structure capable of improving the productivity by minimizing the test time. Especially, four data pads are used to test the data input and output operations, and four channels of the test apparatus are allocated. Thus, the number of semiconductor memory devices the test apparatus can simultaneously test is reduced and it takes a lot of time to test a large number of semiconductor memory devices.

SUMMARY OF THE INVENTION

Embodiments of the present invention are directed to providing a semiconductor memory device capable of sequentially connecting a plurality of banks to one data pad by increasing a burst length in testing a read operation and a write operation.

In accordance with an aspect of the present invention, there is provided a unit characterized in that a burst length is increased in a test of a read operation and a write operation and a unit for connecting a plurality of banks to one data pad by sequentially and outputting the data.

In accordance with the present invention, the number of data pads used in the test operation is reduced by increasing the burst length more than two times. A plurality of banks are sequentially selected and data are written to or read from the banks. In this way, the productivity of the semiconductor memory device is improved. The conventional test method is a parallel operation scheme to find internal defects by simultaneously writing and reading data to/from the banks. In this case, data are output through as many data pads as the minimal banks. In order to output the data, as many channels as the data pads must be allocated in the test apparatus. The conventional testing method has a disadvantage in that it takes a lot of time to test the mass-produced semiconductor memory devices. However, in accordance with the present invention, mass-produced semiconductor memory devices can be simultaneously tested while minimizing the number of channels to be allocated to the respective semiconductor memory devices. To this end, the burst length in the test operation is increased by the product of the number of data pads conventionally used and the predefined burst length. Therefore, a large quantity of semiconductor memory devices can be simultaneously tested by using one data pad.

DESCRIPTION OF SPECIFIC EMBODIMENTS

Hereinafter, a semiconductor memory device in accordance with the present invention will be described in detail with reference to the accompanying drawings.

Figure 1:
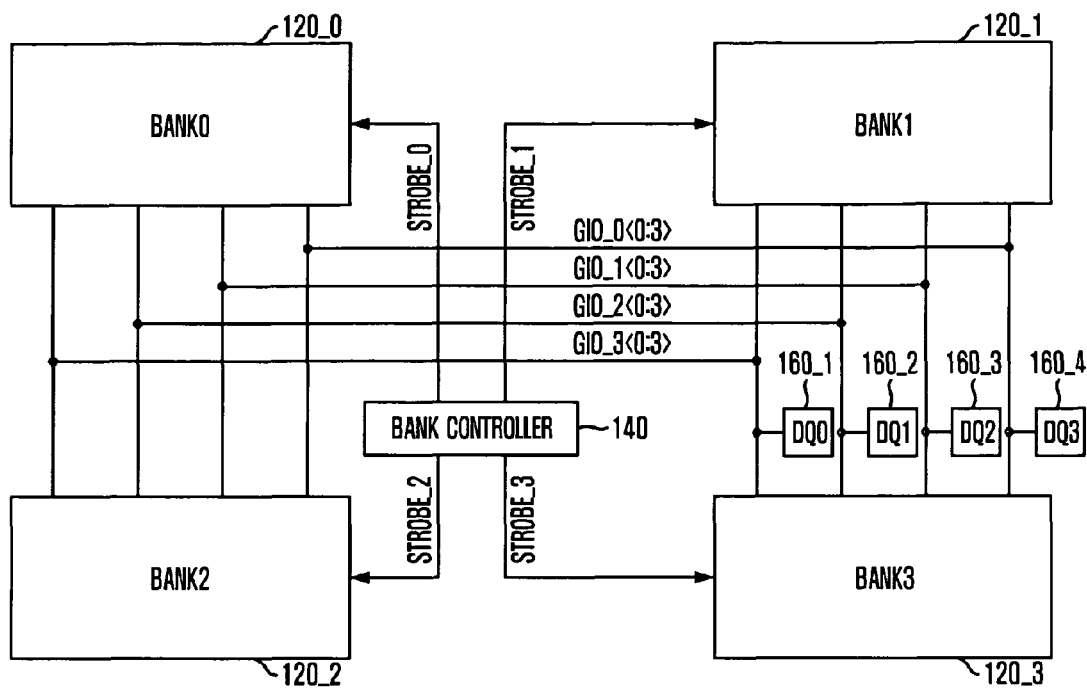
FIG. 1 is a block diagram of a conventional semiconductor memory device.
Figure 2:
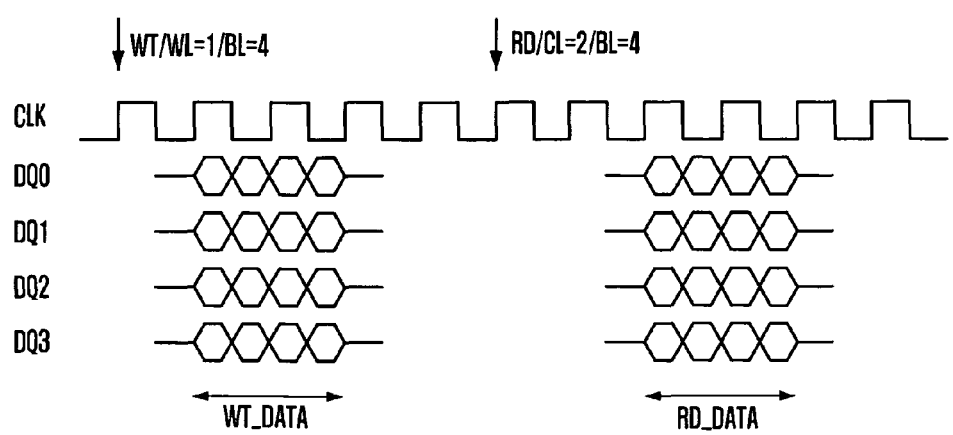
FIG. 2 is a timing diagram illustrating data input/output timing of the conventional semiconductor memory device of FIG. 1.
Figure 3:
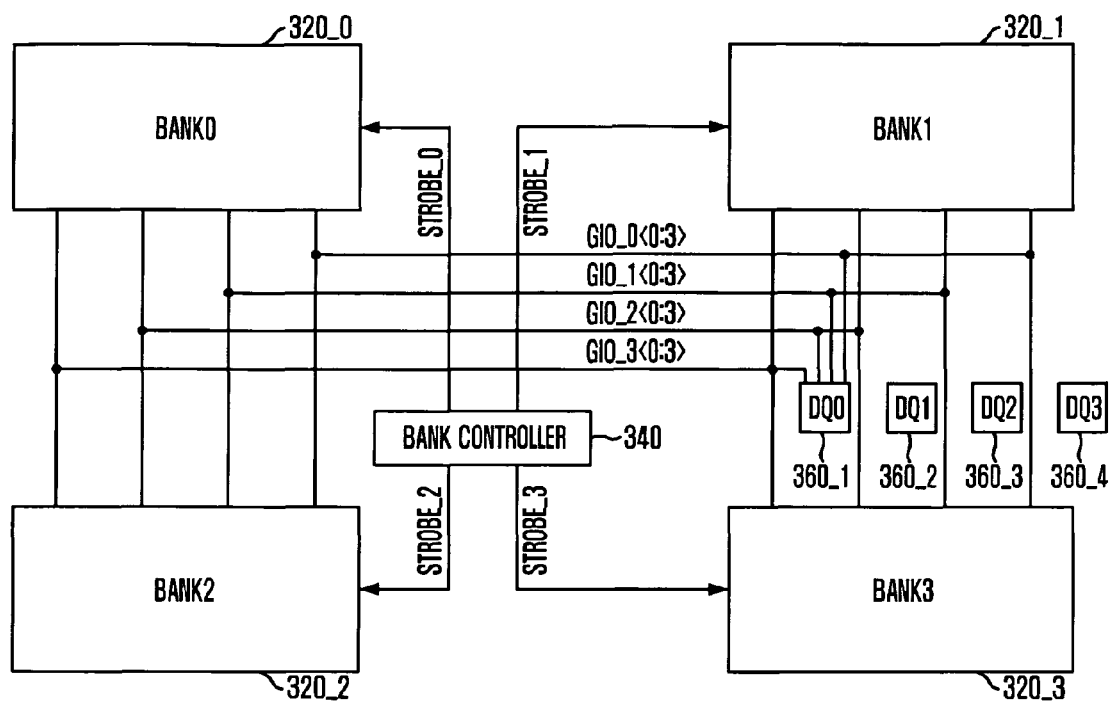
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device includes a plurality of banks 320_0 to 320_3, a bank controller 340 configured to enable the banks 320_0 to 320_3, and a plurality of data pads 360_1 to 360_4 through which data output from the banks 320_0 to 320_3 are transferred to the outside. Although FIG. 3 illustrates the data pads used to transfer data output from the banks in a test operation after the fabrication of the semiconductor memory device, more data pads are included in the semiconductor memory device.

When a read or write command is input to a semiconductor memory device in a test operation, the bank controller 340 sequentially activates bank select signals STROBE_0 to STROBE_3 for selecting the respective banks 320_0 to 320_3. When the write command is input, data input through one data pad 360_1 are stored in the sequentially selected banks 320_0 to 320_3. When the read command is input, data stored in the sequentially selected banks 320_0 to 320_3 are output through one data pad 360_1.

Figure 4:
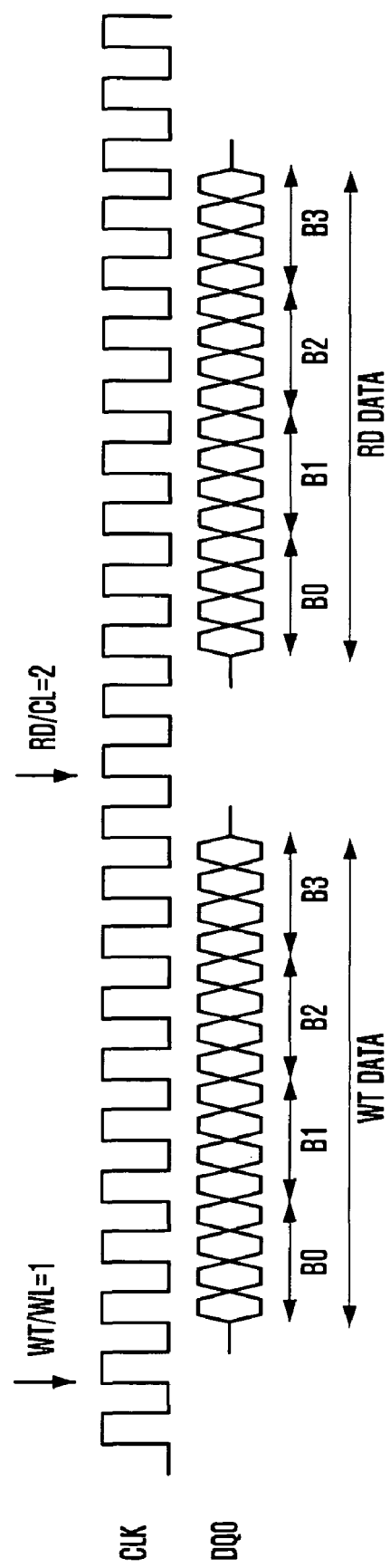
FIG. 4 is a timing diagram illustrating data input/output timing of the semiconductor memory device of FIG. 3.

FIG. 4 is a timing diagram illustrating data input/output timing of the semiconductor memory device of FIG. 3. It is assumed that a write latency (WL) is 1tCK, a column address strobe (CAS) latency (CL) is 2tCK, and a burst length (BL) is 4. However, in the test operation, the burst length increases four times in order to use one data pad instead of four data pads.

Referring to FIG. 4, when a write command WT is input to the semiconductor memory device, write data are input through one data pad DQ0 after the write latency (WL) of 1tCK. The input write data are transferred through global input/output lines GIO_0<0:3> to GIO_3<0:3> to banks 120_0 to 120_3 selected by bank select signals STROBE_0 to STROBE_3 connected to the banks 320_0 to 320_3 sequentially selected by the bank select signals STROBE_0 to STROBE_3 activated in response to the write command WT.

When a read command RD is input, stored data are output through one data pad DQ0 after the CAS latency (CL) of 2tCK. The bank controller 340 sequentially activates the bank select signals STROBE_0 to STROBE_3 in response to the read command RD. The data output from the banks 320_0 to 320_3 selected by the activated bank select signals STROBE_0 to STROBE_3 are transferred to one data pad DQ0 360_1 through the global input/output lines GIO_0<0:3> to GIO_3<0:3>. At this point, the input or output data are transferred in synchronization with the rising and falling edges of a system clock CLK. In addition, a plurality of data corresponding to four times the burst length are successively transferred through one data pad DQ0.

Figure 5:
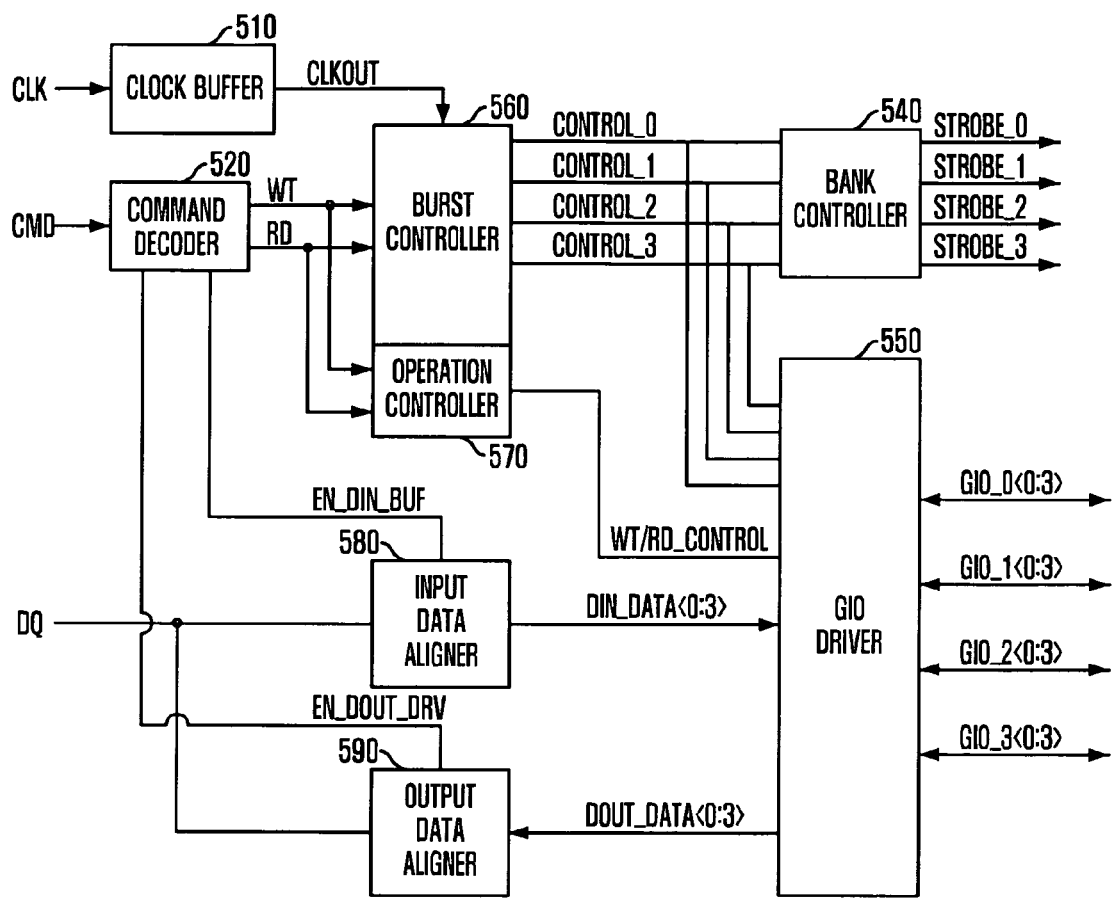
FIG. 5 is a block diagram a test related circuit in the semiconductor memory device.

FIG. 5 is a block diagram of a test related circuit in the semiconductor memory device.

Referring to FIG. 5, the semiconductor memory device can sequentially connect the plurality of banks 320_0 to 320_3 to one data pad DQ0 by increasing the burst length when testing the read and write operations. When testing the write operation, the banks 320_0 to 320_3 receive data corresponding to a burst length among a plurality of external data. When testing the read operation, the banks 320_0 to 320_3 sequentially output data corresponding to the burst length to the outside.

The semiconductor memory device in accordance with the embodiment of the present invention includes a bank controller 540 configured to sequentially select the banks 320_0 to 320_3, a GIO driver 550 configured to serially transfer parallel data through the global input/output lines GIO_0<0:3>, GIO_1<0:3>, GIO_2<0:3> and GIO_3<0:3>, and a burst controller 560 configured to control the bank controller 540 and the GIO driver 560 by activating a plurality of control signals CONTROL_0, CONTROL_1, CONTROL_2 and CONTROL_3 at period intervals of the system clock, which correspond to the burst length (BL).

In addition, the semiconductor memory device further includes a command decoder 520 configured to decode an external command CMD to determine whether the command is the read command RD or the write command WT, and output the decoding result to the burst controller 560, and an operation controller 570 configured to output a command decoding signal WT/RD_CONTROL to the GIO driver 550, the command decoding signal WT/RD_CONTROL having different logic levels in the read command RD and the write command WT. The command decoding signal WT/RD_CONTROL has a first logic level (e.g., a logic high level) in the write command WT, and has a second logic level (e.g., a logic low level) complementary to the first logic level in the write command RD. The GIO driver 550 determines the connection states of the global input/output lines GIO_0<0:3>, GIO_1<0:3>, GIO_2<0:3> and GIO_3<0:3> in response to the command decoding signal WT/RD_CONTROL and the control signals CONTROL_0, CONTROL_1, CONTROL_2 and CONTROL_3.

In order to transfer data between the GIO driver 550 and the data pads DQ, the semiconductor memory device further includes an input data aligner 580 and an output data aligner 590. Specifically, the input data aligner 580 aligns data input in response to a first enable signal EN_DIN_BUF output from the command decoder 520, and outputs the aligned data to the GIO driver 550. The output data aligner 590 aligns data transferred through the GIO driver 550 in response to a second enable signal EN_DOUT_BUF output from the command decoder 520, and outputs the aligned data to the outside. The input data aligner 580 aligns the serially input data in parallel and outputs them to the GIO driver 550, and the output data aligner 590 serializes the parallel data and outputs them to the data pads DQ.

The semiconductor memory device further includes a clock buffer 510 configured to enable the internal operation to be performed according to the external system clock CLK, buffer the system clock CLK, and transfer the buffered system clock to the burst controller 560. The system clock CLK serves as the reference of the activation timing of the control signals CONTROL_0, CONTROL_1, CONTROL_2 and CONTROL_3 corresponding to the burst length (BL).

Referring to FIG. 5, the test related circuit includes the clock buffer 510, the command decoder 520, the bank controller 540, the GIO driver 550, the burst controller 560, the operation controller 570, the input data aligner 580, and the output data aligner 590. The operation of the test related circuit during the test operation will be described below.

The case of testing the semiconductor memory device by applying the write command WT will now be described. The command decoder 520 recognizes the write command WT by decoding the input command CMD, notifies it to the burst controller 560 and the operation controller 570, and outputs the first enable signal EN_DIN_BUF activated for operating the input data aligner 580. In response to the write command WT, the burst controller 560 receives an internal clock CLKOUT from the clock buffer 510 to output the control signals CONTROL_0, CONTROL_1, CONTROL_2 and CONTROL_3. The control signals CONTROL_0, CONTROL_1, CONTROL_2 and CONTROL_3 are sequentially activated at period intervals of the system clock CLK corresponding to the burst length (BL). That is, when the first control signal CONTROL_0 is activated, the second control signal CONTROL_1 is activated after the elapse of the period of the system clock CLK corresponding to the burst length (BL). The bank controller 540 receiving the sequentially activated control signals CONTROL_0, CONTROL_1, CONTROL_2 and CONTROL_3 sequentially output the bank select signals STROBE_0 to STROBE_3 for activating the banks 320_0 to 320_3.

The operation controller 570 receiving the write command WT outputs the command decoding signal WT/RD_CONTROL of a corresponding logic level to the GIO driver 550. The GIO driver 550 receives data from the input data aligner 580 in response to the control signals CONTROL_0, CONTROL_1, CONTROL_2 and CONTROL_3 and the command decoding signal WT/RD_CONTROL, and sequentially transfers the received data to the global input/output lines GIO_0<0:3>, GIO_1<0:3>, GIO_2<0:3> and GIO_3<0:3> connected to the banks 320_0 to 320_3.

The data DIN_DATA<0:3> input through one data pad and aligned by the input data aligner 580 as many as the burst length (BL) are input to the banks enabled by the bank select signals STROBE_0 to STROBE_3 output from the bank controller 540 through the global input/output lines GIO_0<0:3>, GIO_1<0:3>, GIO_2<0:3> and GIO_3<0:3>. In this way, it is possible to test the write operation of storing the data input with the external write command WT in unit cells of the banks 320_0, 320_1, 320_2 and 320_3.

The case of testing the semiconductor memory device by applying the write command RD will be described below. The command decoder 520 recognizes the read command RD by decoding the input command CMD, and notifies it to the burst controller 560 and the operation controller 570. The following description will be focused on an operation differing from the operation of the write command WT. The burst controller 560 outputs the control signals CONTROL_0, CONTROL_1, CONTROL_2 and CONTROL_3 with respect to the read command RD. Meanwhile, the operation controller 570 outputs the command decoding signal WT/RD_CONTROL having a logic level corresponding to the read command RD. At this point, the logic level of the command decoding signal WT/RD_CONTROL is complementary to the logic level corresponding to the write command WT.

The bank controller 540 receiving the control signals CONTROL_0, CONTROL_1, CONTROL_2 and CONTROL_3 outputs the bank select signals STROBE_0 to STROBE_3 sequentially activated. The banks 320_0 to 320_3 enabled in response to the bank select signals STROBE_0 to STROBE_3 transfer data to the GIO driver 550 through the global input/output lines GIO_0<0:3>, GIO_1<0:3>, GIO_2<0:3> and GIO_3<0:3>. The GIO driver 550 sequentially connects the global input/output lines GIO_0<0:3>, GIO_1<0:3>, GIO_2<0:3> and GIO_3<0:3> to the output data aligner 590 in response to the control signals CONTROL_0, CONTROL_1, CONTROL_2 and CONTROL_3. In this way, data stored in unit cells of the respective banks 320_0 to 320_3 are output to one data pad DQ through the output data aligner 590.

Figure 6:
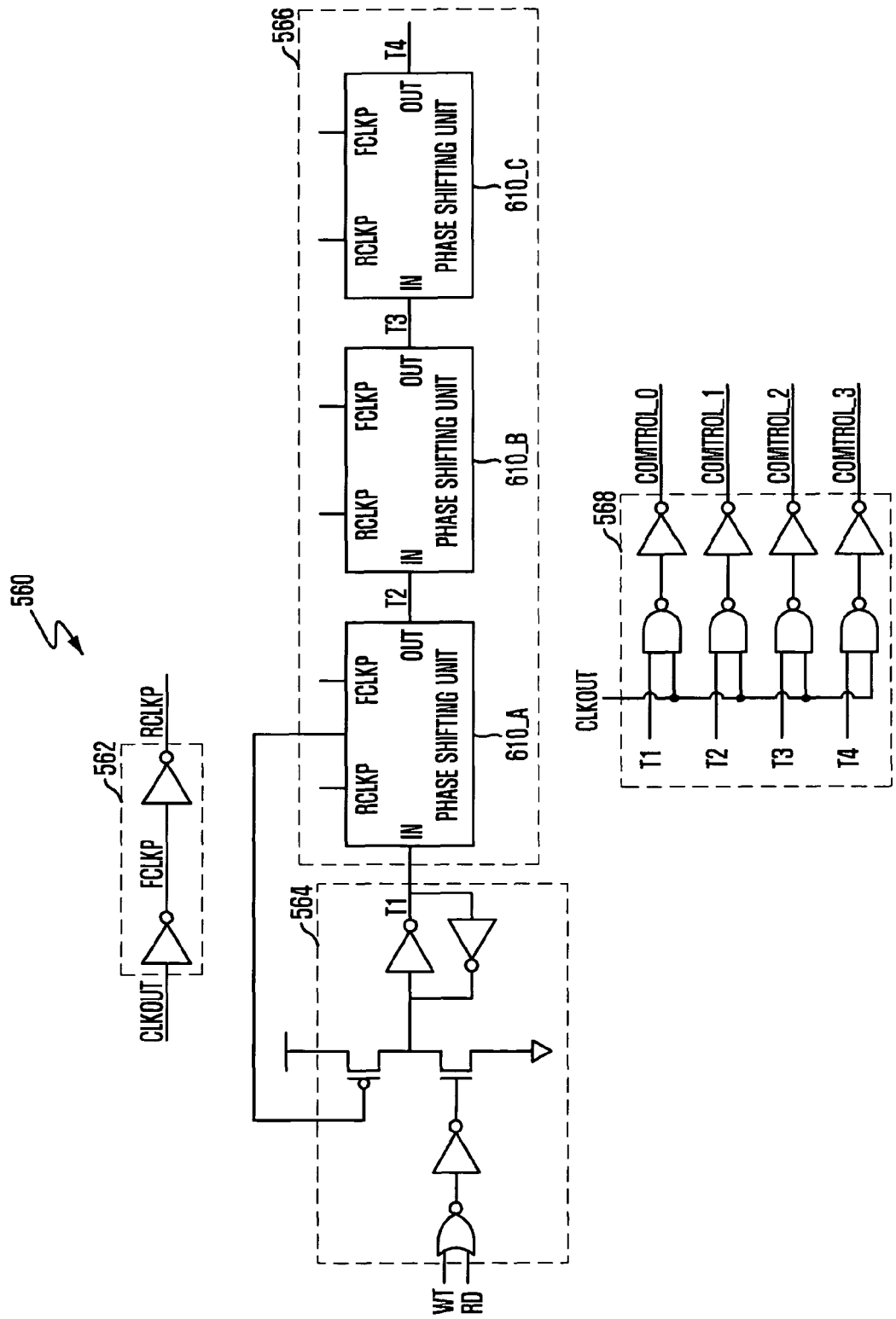
FIG. 6 is a block diagram of a burst controller of FIG. 5.

FIG. 6 is a block diagram of the burst controller 560 of FIG. 5.

Referring to FIG. 6, the burst controller 560 includes a first pulse generating unit 564 configured to generate a first control pulse T1 in response to one of the read command RD and the write command WT, a second pulse generating unit 566 configured to shift a phase of the first control pulse T1 to generate second to fourth control pulses T2 to T4 having phase difference corresponding to the period interval of the system clock corresponding to the burst length (BL), and an output unit 568 configured to output the control signals CONTROL_0, CONTROL_1, CONTROL_2 and CONTROL_3 by synchronizing the first to fourth control pulses T1 to T4 with the system clock CLK. Specifically, the first pulse generating unit 564 generates the first control pulse T1 having an activation period corresponding to one period of the system clock CLK by using a signal fed back from the second pulse generating unit 566. In addition, the second pulse generating unit 566 includes a plurality of phase shifting units 610_A, 610_B and 610_C configured to shift the phase of the first control pulse T1.

More specifically, the first pulse generating unit 564 includes an NMOS transistor configured to transfer a ground voltage level in response to the write command WT or the read command RD, a PMOS transistor configured to transfer a power supply voltage level in response to the feedback signal, and an inverter latch configured to invert a level transferred through the NMOS transistor and the PMOS transistor. The output unit 568 includes a plurality of NAND gates and a plurality of inverters configured to synchronize the first to fourth control pulses T1 to T4 output from the first and second pulse generating units 564 and 566 with the internal clock CLKOUT.

The phase shifting units 610_A, 610_B and 610_C of the second pulse generating unit 566 can shift the phase by ½ period of the system clock CLK. The burst controller 560 further includes a clock generating unit 562 configured to a rising clock RCLKP and a falling clock FCLK synchronized with a rising edge and a falling edge of the system clock CLK in order for phase shift.

Figure 7:
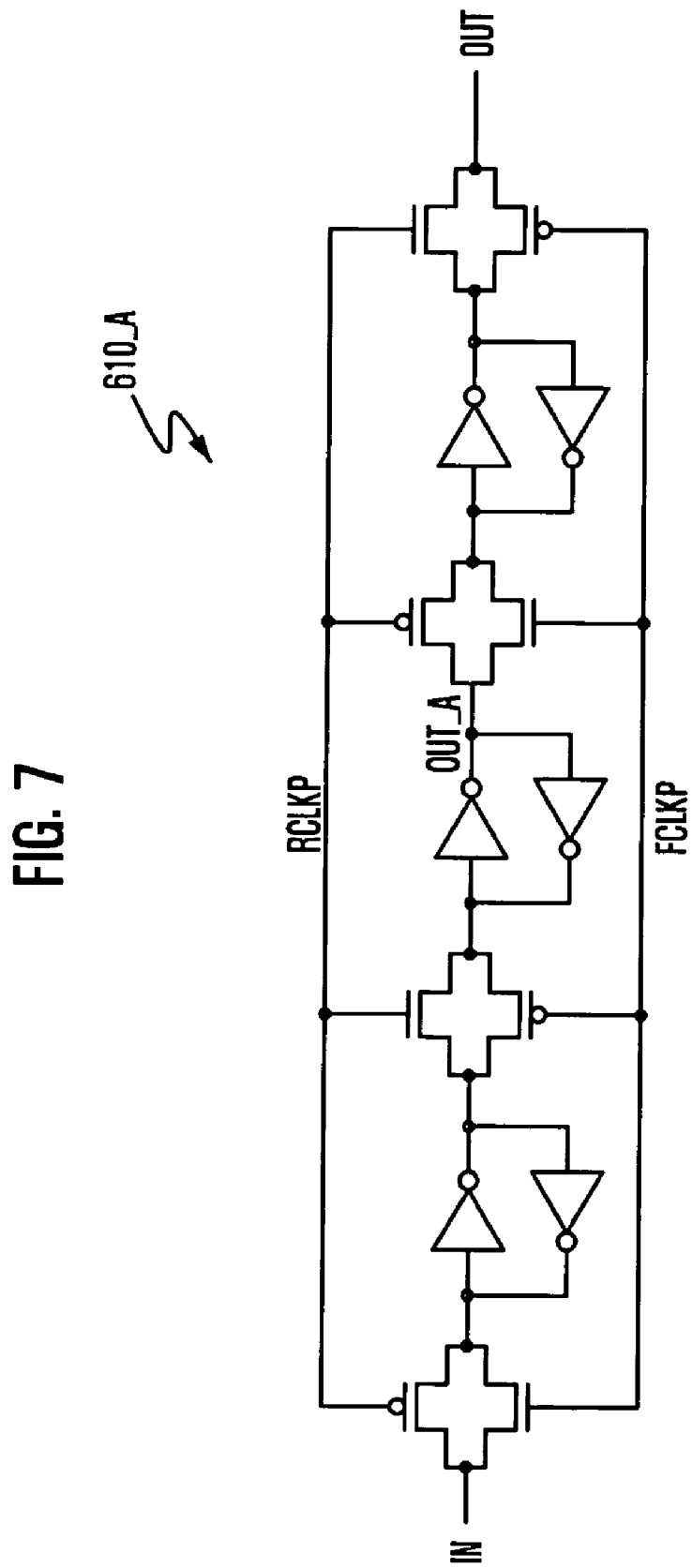
FIG. 7 is a circuit diagram of a phase shifting unit of FIG. 6.

FIG. 7 is a circuit diagram of the phase shifting unit 610_A of FIG. 6.

Referring to FIG. 7, the phase shifting unit 610_A includes a plurality of delay units configured to shift the phase by ½ period of the system clock CLK. The delay unit includes a transfer gate and a latch. A total number of the transfer gates correspond to the burst length (BL). In addition, the phase shifting unit 610_A shifts the phase of the input signal by one period of the system clock CLK and feeds back the phase-shifted signal OUT_A to the first pulse generating unit 564.

Since the phase shifting units 610_B and 610_C of the second pulse generating unit 566 have the same structure as the first phase shifting unit 610_A, detailed description thereof will be omitted. In addition, when a semiconductor memory device in accordance with another embodiment of the present invention inputs or outputs four data, not two data, during one period of the system clock CLK, the number of transfer gates controlled by the rising and falling clocks RCLKP and FCLKP of the system clock CLK can be reduced by half.

Figure 8:
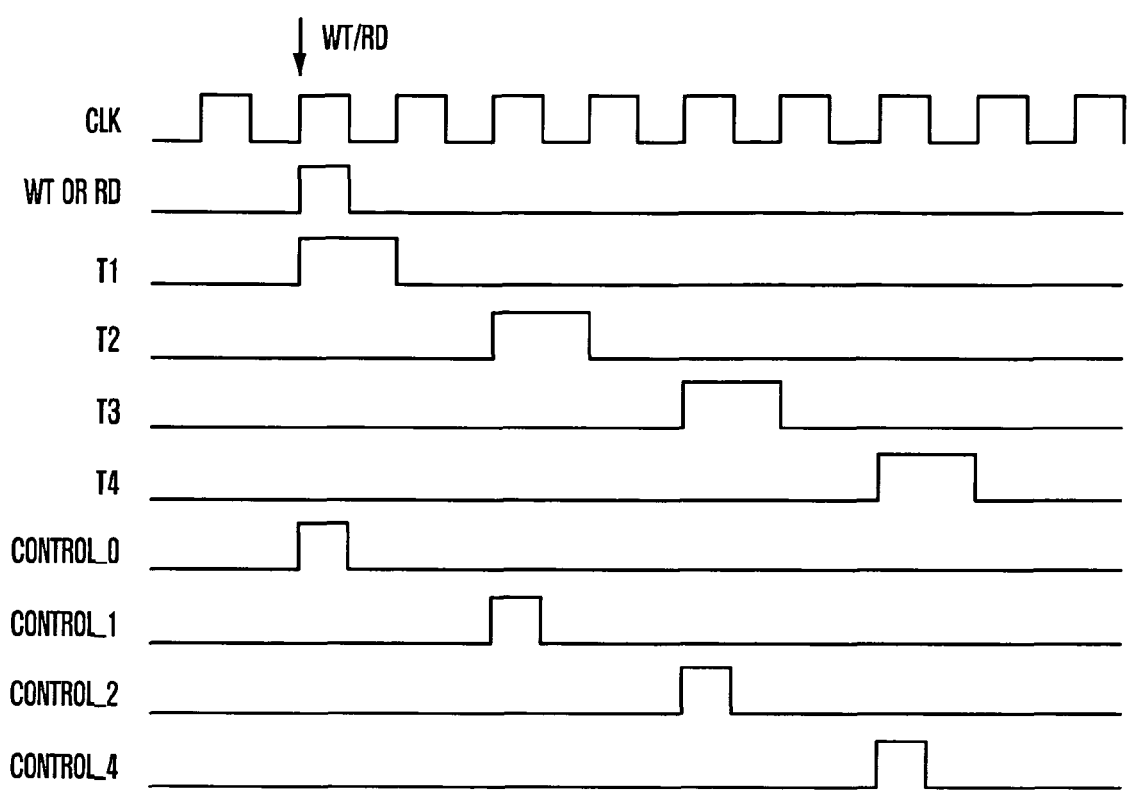
FIG. 8 is a timing diagram illustrating the operation of the burst controller of FIG. 6.

FIG. 8 is a timing diagram illustrating the operation of the burst controller 560 of FIG. 6.

Referring to FIG. 8, when the write command WT or the read command RD is input in synchronization with the rising edge of the external system clock CLK, the command decoder 520 notifies the input of the write command WT or the read command RD to the burst controller 560. The first pulse generating unit 564 of the burst controller 560 generates the first control pulse T1 having a pulse width corresponding to one period of the system clock CLK, and the second pulse generating unit 566 generates the second to fourth control pulses T2 to T4 by shifting the phase of the first control pulse T1 by the period of the system clock CLK corresponding to the burst length (BL). The output unit 568 outputs the first to fourth control pulses T1 to T4 in synchronization with the rising edge of the system clock CLK.

Figure 9:
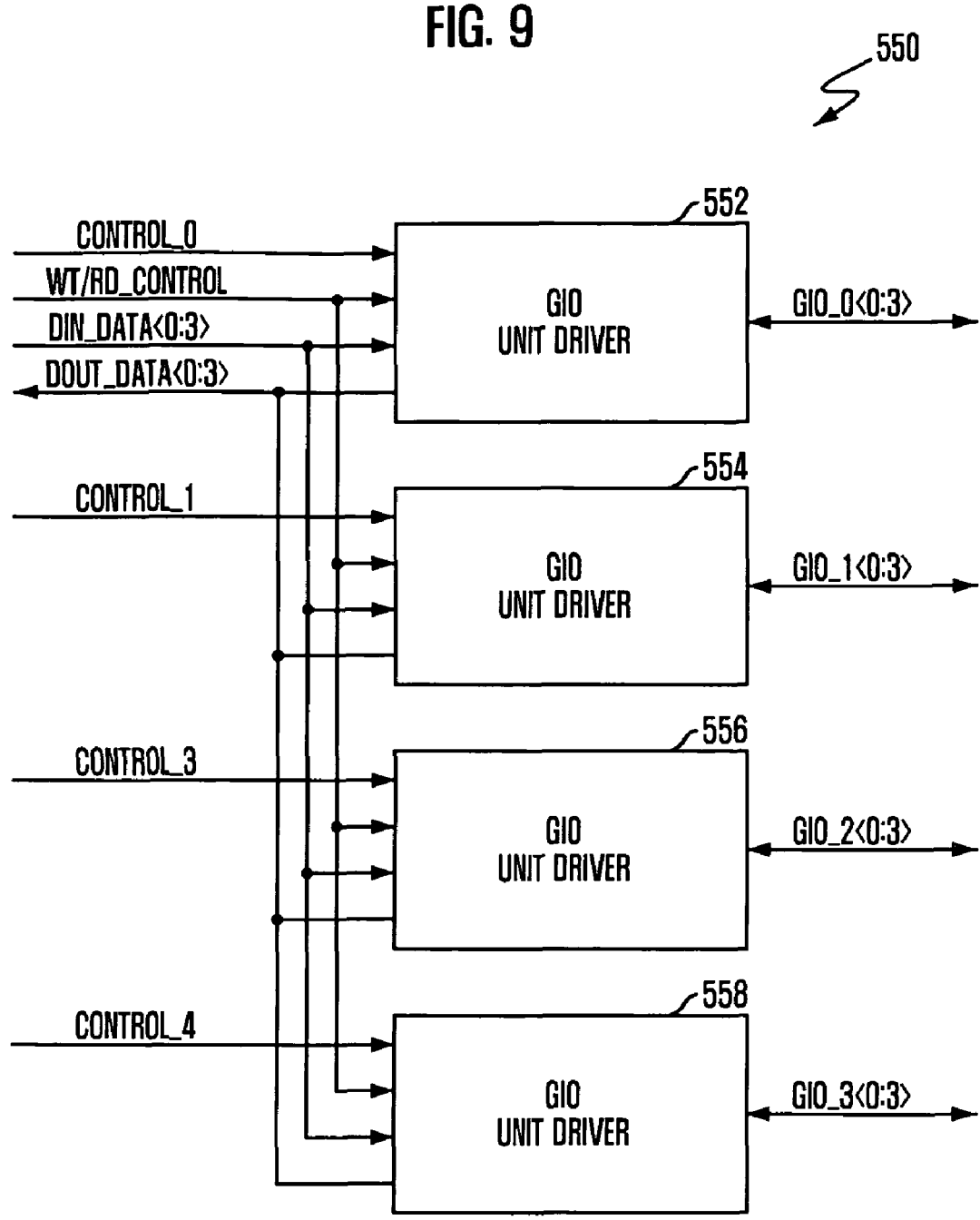
FIG. 9 is a block diagram of the GIO driver of FIG. 5.

FIG. 9 is a block diagram of the GIO driver 550 of FIG. 5.

Referring to FIG. 9, the GIO driver 550 includes a plurality of unit drivers 552, 554, 556 and 558 respectively connected to the plurality of global input/output lines GIO_0<0:3>, GIO_1<0:3>, GIO_2<0:3> and GIO_3<0:3>.

The unit drivers 552, 554, 556 and 558 selectively connect the input data aligner 580 and the output data aligner 590 to the global input/output lines GIO_0<0:3>, GIO_1<0:3>, GIO_2<0:3> and GIO_3<0:3> in response to the control signals CONTROL_0, CONTROL_1, CONTROL_2 and CONTROL_3 and the command decoding signal WT/RD_CONTROL.

Figure 10:
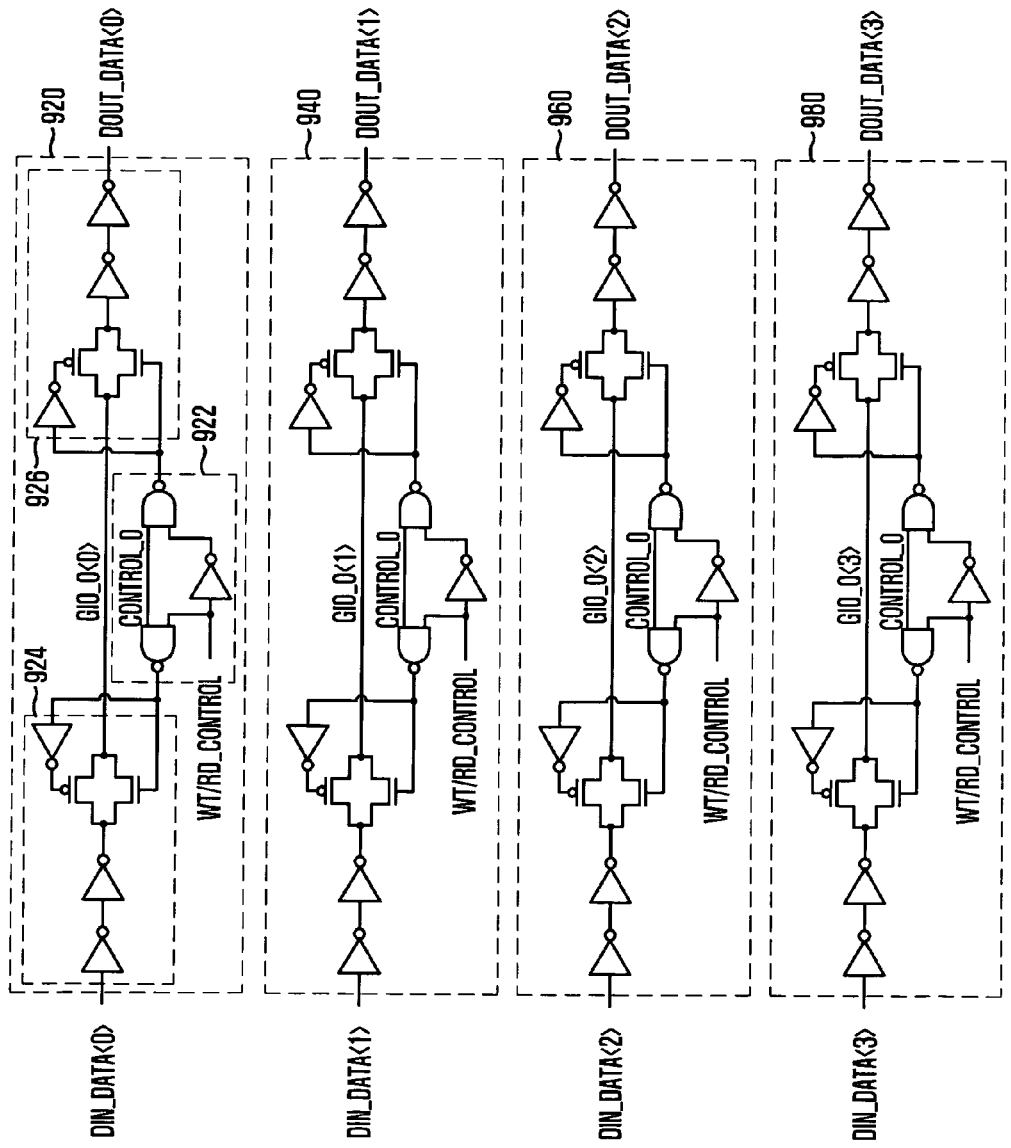
FIG. 10 is a circuit diagram of a unit driver of FIG. 9.

FIG. 10 is a circuit diagram of the unit driver 552 of FIG. 9.

Referring to FIG. 10, the unit driver 552 includes a plurality of connecting units 920, 940, 960 and 980 configured to connect a plurality of first global input/output lines GIO_0<0:3> to data DIN_DATA<0:3> and DOUT_DATA<0:3> input or output through the input data aligner 580 or the output data aligner 590.

More specifically, the connecting unit 920 includes a write driver 924, a read driver 926, and a controller 922. The write driver 924 transfers the data DIN_DATA<0> to the first global input/output line GIO_0<0>, wherein the data DIN_DATA<0> is input through the data pad DQ and aligned in parallel by the input data aligner 580. The read driver 926 transfers the data DIN_DATA<0> received through the first global input/output line GIO_0<0> to the output data aligner 590 so as to output the data DOUT_DATA<0> to the data pad DQ. The controller 922 controls the write driver 924 and the read driver 926 in response to the command decoding signal WT/RD_CONTROL and the first control signal CONTROL_0.

Each of the write driver 924 and the read driver 926 includes a transfer gate responsive to the command decoding signal WT/RD_CONTROL and the first control signal CONTROL_0. The controller 922 includes a NAND gate configured to control the transfer gate in response to the command decoding signal WT/RD_CONTROL and the first control signal CONTROL_0. The controller 922 is designed such that the command decoding signal WT/RD_CONTROL has a logic high level in the case of the write command WT, and has a logic low level in the case of the read command RD. The design of the controller 922 can be modified according to the logic level of the command decoding signal WT/RD_CONTROL determined by the external input command.

Figure 11:
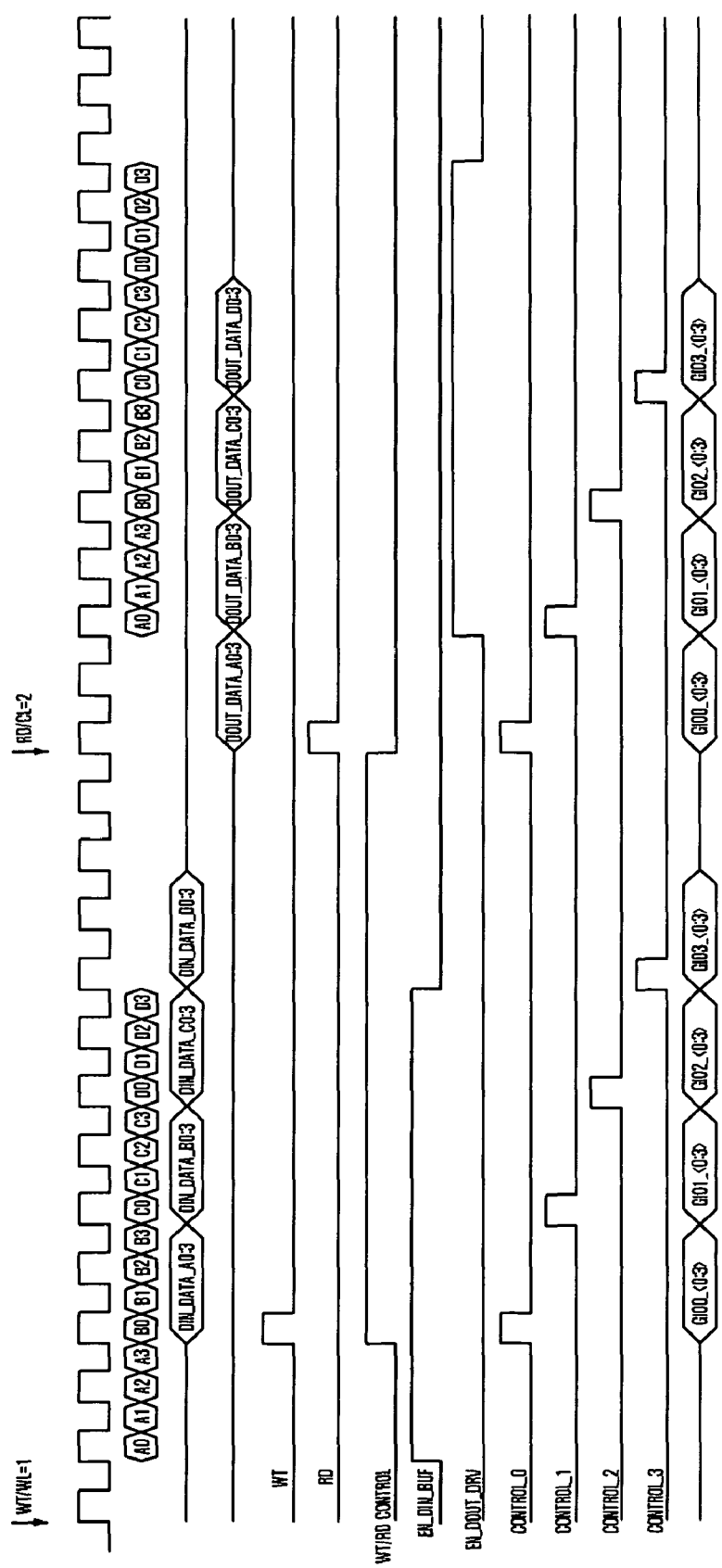
FIG. 11 is a timing diagram illustrating the operation of the test related circuit of FIG. 5.

FIG. 11 is a timing diagram illustrating the operation of the test related circuit of FIG. 5. It is assumed herein that the write latency (WL) is 1tCK, the CAS latency (CL) is 2tCK, and the burst length (BL) is 4.

When the write command WT is input to the semiconductor memory device, a plurality of data A0 to A3, B0 to B3, C0 to C3 and D0 to D4 are input after the elapse of the write latency (WL) of 1 tCK. The input data A0 to A3, B0 to B3, C0 to C3 and D0 to D4 are aligned in parallel by the input data aligner 580. The command decoder 520 recognizes the external input command CMD as the write command WT and activates the first enable signal EN_DIN_BUF to enable the input data aligner 580. Then, the command decoder 520 notifies the write command WT to the burst controller 560 and the operation controller 570 at a time point when the first data is input. The burst controller 560 generates the first control signal CONTROL_0 in response to the write command WT, and the GIO driver 550 transfers the four data DIN_DATA_A<0:3>, which are first aligned, to the first global input/output lines GIO_0<0:3> in response to the first control signal CONTROL_0. Thereafter, the aligned data pairs DIN_DATA_B<0:3>, DIN_DATA_C<0:3> and DIN_DATA_D<0:3> are sequentially transferred to the global input/output lines GIO_1<0:3>, GIO_2<0:3> and GIO_3<0:3>.

When the read command RD is input to the semiconductor memory device, the command decoder 520 notifies the read command RD to the burst controller 560 and the operation controller 570 without delay. The GIO driver 550 transfers, to the output data aligner 590, the data DIN_DATA_A<0:3>, DIN_DATA_B<0:3>, DIN_DATA_C<0:3> and DIN_DATA_D<0:3> output in response to the control signals CONTROL_0, CONTROL_1, CONTROL_2 and CONTROL_3 for sequentially enabling the banks 320_0 to 320_3. The data A0 to A3, B0 to B3, C0 to C3 and D0 to D4 are output to the outside through one data pad DQ in response to the second enable signal EN_DOUT_DRV activated at a time point when the CAS latency (CL) of 2 tCK elapses from the input of the read command RD.

Since the semiconductor memory device in accordance with the embodiment of the present invention supports the test of the entire unit cells through one data pad DQ, it can simultaneously test more semiconductor memory devices. Therefore, a total test time of the mass-produced semiconductor memory devices can be reduced. Specifically, the semiconductor memory device can be tested using one data pad by increasing the burst length (BL) by the product of the number of data pads used in the conventional test and the burst length. More specifically, a plurality of data are aligned in parallel and transferred to the global input/output lines. Then, the data are written to the unit cells of the banks sequentially enabled. On the other hand, the data output from the banks sequentially enabled are aligned in series and then output to the outside.

In the conventional test technique, data simultaneously selecting the data pads and the banks are input or output in parallel. However, in accordance with the present invention, since one data pad is used by increasing the burst length by a predetermined time, a test time of the individual semiconductor memory devices is slightly increased, but more semiconductor memory devices can be simultaneously tested, thereby reducing a total test time.

Although the global input/output lines are separately driven for the read and write operations, the banks can be simultaneously enabled and data corresponding to the burst length can be input to all the banks according to the test environment and conditions, without sequentially enabling the banks in the write operation. Further, the data can be sequentially output by individually enabling the banks only in the read operation. In this case, when the write command WT is input, the control signals CONTROL_0, CONTROL_1, CONTROL_2 and CONTROL_3 are simultaneously activated, and the data aligned by the input data aligner 580 are transferred to the global input/output lines GIO_0<0:3>, GIO_1<0:3>, GIO_2<0:3> and GIO_3<0:3>. When the read command RD is input, the control signals CONTROL_0, CONTROL_1, CONTROL_2 and CONTROL_3 are sequentially activated, and the GIO driver 550 is controlled to transfer sequentially transfer the data from the banks to the output data aligner 590. This method can further reduce the test time than that of FIG. 11.

In accordance with the embodiments of the present invention, the semiconductor memory device can be simultaneously tested using fewer channels of the test apparatus than the related art, thereby improving the productivity of the semiconductor memory device.

Specifically, although a test time of the individual semiconductor memory devices is increased, a total test time is reduced because more semiconductor memory devices can be simultaneously tested. Furthermore, the testing method in accordance with the present invention can detect defects of unit cells in each bank even though a plurality of banks are tested using one data pad, thereby preventing the degradation of the test reliability.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a unit configured so that a burst length is increased in a test of a read operation and a write operation;
   a unit for connecting a plurality of banks to one data pad by sequentially and outputting data;
   a bank controller configured to sequentially activate the plurality of banks connected to the one data pad;
   a driver configured to receive the data transferred in parallel through a plurality of global input/output lines, and transfer the received data in series; and
   a burst controller configured to control the bank controller and the driver by activating a plurality of control signals at a period interval of a system clock, which corresponds to the burst length.

2. The semiconductor memory device as recited in claim 1, wherein, in the test of the write operation, the plurality of banks receive data corresponding to the burst length among a plurality of external data and, in the test of the read operation, the plurality of banks sequentially output data corresponding to the burst length external to the device.

3. The semiconductor memory device as recited in claim 1, wherein the burst controller comprises:
   a first pulse generating unit configured to generate a first control pulse in response to one of the read command and the write command;
   a second pulse generating unit configured to generate second to fourth control pulses having a phase difference corresponding to the period interval of the system clock by shifting a phase of the first control pulse; and
   an output unit configured to output the plurality of control signals by synchronizing the first to fourth control pulses with the system clock.

4. The semiconductor memory device as recited in claim 3, wherein the first pulse generating unit generates the first control pulse having an activation period corresponding to one period of the system clock by using a signal fed back from the second pulse generating unit.

5. The semiconductor memory device as recited in claim 3, wherein the second pulse generating unit comprises a plurality of phase shifting units configured to shift a phase of the first control pulse, each of the phase shifting units including a plurality of delay units configured to shift the phase of the first control pulse by ½ period of the system clock, the number of the delay units corresponding to the burst length.

6. The semiconductor memory device as recited in claim 1, wherein the driver comprises a plurality of unit drivers configured to connect the plurality of global input/output lines corresponding to the banks to the data pad in response to the plurality of control signals.

7. The semiconductor memory device as recited in claim 6, wherein the unit driver comprises:
   a write driver configured to sequentially transfer data received through the data pad to the plurality of global input/output lines;
   a read driver configured to sequentially output data transferred through the plurality of global input/output lines to the data pad; and
   a controller configured to control the write driver and the read driver in response to the read and write commands and the control signals.

8. The semiconductor memory device as recited in claim 1 wherein the semiconductor memory device further comprises:
   a command decoder configured to decode an external command to determine whether the external command is the read command or the write command, and output the decoding result to the burst controller; and
   an operation controller configured to output a command decoding signal to the driver, the command decoding signal having a logic level different in the read command and the write command.

9. The semiconductor memory device as recited in claim 8, wherein the command decoding signal output from the operation controller has a first logic level in the write command and a second logic level complementary to the first logic level in the read command, and the driver determines the connection state of the global input/output lines in response to the command decoding signal and the control signals.

10. The semiconductor memory device as recited in claim 8, wherein the semiconductor memory device further comprises:
   an input data aligner configured to align serial input data in parallel in response to a first enable signal output from the command decoder; and an output data aligner configured to align parallel data received from the driver in series in response to a second enable signal output from the command decoder, and output the serially aligned data to the output side.

11. The semiconductor memory device as recited in claim 9, wherein the semiconductor memory device further comprises a clock buffer configured to buffer the system clock and transfer the buffered system clock to the burst controller.

12. A semiconductor memory device, comprising:
a burst controller configured to generate a plurality of control signals for increasing a predefined burst length more than two times in response to a read command and a write command in a test operation;
a data align buffer configured to align input data and output data;
a driver configured to sequentially connect the data align buffer to a plurality of global input/output lines in response to the plurality of control signals
a command decoder configured to decode an external command to determine whether the external command is the read command or the write command, and output the decoding result to the burst controller; and
an operation controller configured to output a command decoding signal to the driver, the command decoding signal having a logic level different in the read command and the write command.

13. The semiconductor memory device as recited in claim 12, wherein the burst controller comprises:
a first pulse generating unit configured to generate a first control pulse in response to one of the read command and the write command;
a second pulse generating unit configured to generate second to fourth control pulses having a phase difference corresponding to the period interval of the system clock by shifting a phase of the first control pulse; and
an output unit configured to output the plurality of control signals by synchronizing the first to fourth control pulses with the system clock.

14. The semiconductor memory device as recited in claim 12, wherein the driver comprises a plurality of unit drivers configured to connect the plurality of global input/output lines corresponding to the banks to the data pad in response to the plurality of control signals.

15. The semiconductor memory device as recited in claim 14, wherein the unit driver comprises:
a write driver configured to sequentially transfer data received through the data pad to the plurality of global input/output lines;
a read driver configured to sequentially output data transferred through the plurality of global input/output lines to the data pad; and
a controller configured to control the write driver and the read driver in response to the read and write commands and the control signals.

16. A method for testing a semiconductor memory device, the method comprising:
generating a plurality of control signals for increasing a predefined burst length more than two times in response to a read command and a write command in a test operation; and
sequentially connecting one data pad to a plurality of banks through a plurality of global input/output lines in response to the plurality of control signals,
wherein the generating the plurality of control signals comprises:
generating a first control pulse in response to one of the read command and the write command;
generating a plurality of control pulses having a phase difference corresponding to the period interval of the system clock by shifting a phase of the first control pulse; and
outputting the plurality of control signals by synchronizing the first control pulse and the plurality of control pulses with the system clock.

17. The method as recited in claim 16, wherein the connecting of the data pad to the plurality of banks through the plurality of global input/output lines comprises:
when the write command is input, sequentially transferring data input through the one data pad to the plurality of banks through the plurality of global input/output lines in response to the plurality of control signals; and
when the read command is input, sequentially transferring data output from the plurality of banks to the one data pad in response to the plurality of control signals.

18. A semiconductor memory device, comprising:
a write tester configured to test a plurality of banks by sequentially transferring, to the plurality of banks, data corresponding to a burst length among a plurality of external data received through one data pad in response to a write command;
a read tester configured to enable the plurality of banks to output stored data corresponding to the burst length in response to a read command, and sequentially output the data external to the device through the one data pad;
a burst controller configured to generate a plurality of control signals activated at a period interval of a system clock, which corresponds to the burst length, in response to the read command and the write command;
a driver configured to sequentially connect the write tester and the read tester to a plurality of global input/output lines in response to the plurality of control signals;
a command decoder configured to decode an external command to determine whether the external command is the read command or the write command, and output the decoding result to the burst controller; and
an operation controller configured to output a command decoding signal to the driver, the command decoding signal having a logic level different in the read command and the write command.

19. The semiconductor memory device as recited in claim 18, further comprising:
a bank controller configured to sequentially select the plurality of banks in response to the plurality of control signals.

20. The semiconductor memory device as recited in claim 18, wherein each of the write tester and the read tester comprises:
a FIFO data buffer connected to the data pad to store input data and output data; and
the driver configured to sequentially connect the FIFO data buffer to the plurality of banks through the plurality of global input/output lines in response to the plurality of control signals.

* * * * *